United States Patent
Hashida (10) Patent No.: US 10,459,531 B2
(45) Date of Patent: Oct. 29, 2019

(54) INPUT DEVICE HAVING BENT PORTION IN SUBSTRATE WITH LARGE LIGHT-TRANSMITTING REGION

(71) Applicant: Alps Alpine Co., Ltd., Tokyo (JP)

(72) Inventor: Junji Hashida, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 209 days.

(21) Appl. No.: 15/618,039

(22) Filed: Jun. 8, 2017

(65) Prior Publication Data

US 2017/0277279 A1 Sep. 28, 2017

Related U.S. Application Data

(63) Continuation of application No. PCT/JP2015/066822, filed on Jun. 11, 2015.

(51) Int. Cl.
*G06F 3/041* (2006.01)
*G06F 3/03* (2006.01)
*H01L 51/00* (2006.01)

(52) U.S. Cl.
CPC ........ *G06F 3/0325* (2013.01); *H01L 51/0023* (2013.01); *H01L 51/0097* (2013.01); *H01L 2251/308* (2013.01)

(58) Field of Classification Search
USPC ................................. 345/173–178
See application file for complete search history.

(56) References Cited

U.S. PATENT DOCUMENTS

| 2015/0122624 A1* | 5/2015 | Kim | G06F 3/044 200/5 R |
| 2015/0382484 A1* | 12/2015 | Jung | G09G 3/3225 361/752 |
| 2016/0364044 A1* | 12/2016 | Kim | H01L 51/0097 |

FOREIGN PATENT DOCUMENTS

| JP | 2011-076514 | 4/2011 |
| JP | 2013-145517 | 7/2013 |
| JP | 2013-186633 | 9/2013 |
| JP | 2014-071472 | 4/2014 |
| JP | 2014-157400 | 8/2014 |
| JP | 2014-241128 | 12/2014 |

OTHER PUBLICATIONS

International Search Report dated Jul. 14, 2015 from International Application No. PCT/JP2015/066822.

* cited by examiner

*Primary Examiner* — Roy P Rabindranath
(74) *Attorney, Agent, or Firm* — Beyer Law Group LLP (57) ABSTRACT

A light-transmitting substrate configuring an input device has a light-transmitting region where electrode parts and light-transmitting wiring parts are formed, and a light-non-transmitting region where light-non-transmitting wiring parts are formed. The light-transmitting region surrounded by an upper end side, both lateral sides, and a bonding boundary part (bend part) is bonded to a panel. The light-non-transmitting region of the substrate is bent inward of a housing from the bonding boundary part (bend part) as a start point, and is connected to a circuit board. The light-transmitting wiring parts are formed of a flexible light-transmitting conductive material layer, and hence the substrate can be bent in the light-transmitting region.

9 Claims, 5 Drawing Sheets

INPUT DEVICE HAVING BENT PORTION IN SUBSTRATE WITH LARGE LIGHT-TRANSMITTING REGION

CLAIM OF PRIORITY

This application is a Continuation of International Application No. PCT/JP2015/066822 filed on Jun. 11, 2015. The entire contents of the application noted above are hereby incorporated by reference.

BACKGROUND OF THE INVENTION

1. Field of the Invention

The present invention relates to an input device that can use a wide range of a substrate as a light-transmitting region.

2. Description of the Related Art

A touch panel described in Japanese Unexamined Patent Application Publication No. 2013-186633 is suggested as a capacitance-type input device. In this input device, a plurality of transparent conductive pattern electrodes formed of, for example, indium tin oxide (ITO), and lower and upper layer wiring parts connected to side parts of the respective transparent conductive patterns are formed on a surface of a transparent substrate. The lower and upper layer wiring parts are formed of a metal material, such as copper, silver, or gold.

The transparent substrate is bent at both side parts of the surface on which the transparent conductive patterns are arrayed. The bending lines at this time are set on the portions on which the lower and upper layer wiring parts are formed. Both bent side surfaces of the transparent substrate serve as wiring regions for the lower and upper layer wiring parts.

Regarding the input device described in Japanese Unexamined Patent Application Publication No. 2013-186633, the transparent substrate is bent at both the side parts of the surface on which the transparent conductive pattern electrodes are arrayed, and both the bent side surfaces of the transparent substrate serve as the wiring regions for the lower and upper layer wiring parts. Hence, the lower and upper layer wiring parts are prevented from widely appearing in a plan view and hence the frame can be narrowed.

However, ITO forming the transparent conductive pattern electrodes is a very brittle conductive material. The transparent substrate cannot be bent at the portion on which the transparent conductive pattern electrodes are formed. The transparent substrate is bent at portions provided with the lower and upper layer wiring parts formed of metal, such as copper, silver, or gold.

With this structure, portions of the lower and upper layer wiring parts formed of the metal material may remain on the side parts of the transparent conductive pattern electrodes in a plan view. Hence, it is required to arrange a frame having a certain width dimension in the periphery of the regions where the transparent conductive pattern electrodes are formed, to cover the portions of the lower wiring parts and the upper layer wiring parts. There may be a limitation when the frame is narrowed as much as possible.

SUMMARY OF THE INVENTION

The present invention addresses the above-described problems of related art. The present invention provides an input device structured such that a light-transmitting region can be expanded as much as possible on a substrate, and a frame called decorative part is no longer required to be provided in front of the substrate, or a minimum required frame is sufficient.

According to an aspect of the present invention, there is provided an input device, in which a plurality of electrode parts formed of a flexible light-transmitting conductive material layer, a plurality of light-transmitting wiring parts respectively continued from the electrode parts and formed of the flexible light-transmitting conductive material layer, and light-non-transmitting wiring parts respectively continued from the light-transmitting wiring parts are provided on a surface of a light-transmitting substrate. The substrate is divided into a light-transmitting region on one side and a light-non-transmitting region on another side with a region boundary part arranged therebetween, an entire region of the light-transmitting region surrounded by a plurality of sides of the substrate and the region boundary part transmits light, and the electrode parts and the light-transmitting wiring parts are formed in the light-transmitting region. The light-non-transmitting wiring parts in which a light-non-transmitting low-resistance material layer overlaps the flexible light-transmitting conductive material layer continued from the light-transmitting wiring parts are formed in the light-non-transmitting region. A bend part for changing an orientation of a plane in which the light-non-transmitting wiring parts are formed with respect to a plane in which the electrode parts are formed is set in the light-transmitting region. The bend part is set at a position situated towards the electrode parts than the region boundary part in a region where the light-transmitting wiring parts are formed.

For example, the input device according to the aspect of the present invention may be configured such that a light-transmitting panel is provided in front of the substrate, a portion of the light-transmitting region is bonded to the panel, and a residual portion of the light-transmitting region and the light-non-transmitting region continued from the residual portion are separated from the panel.

In the input device according to the aspect of the present invention, the substrate may have an end side and two lateral sides orthogonal to the end side, the light-transmitting region may be formed in a region surrounded by the end side and the two lateral sides, and the bend part may be set in a portion in which the two lateral sides are opposite to each other.

Alternatively, the substrate may have an end side, two lateral sides orthogonal to the end side, and a narrow part having a smaller width dimension than an opposition dimension between the two lateral sides, and the region boundary part and the bend part may be set in the narrow part.

In the input device according to the aspect of the present invention, the flexible light-transmitting conductive material layer may contain a conductive nanomaterial. Alternatively, the flexible light-transmitting conductive material layer may be metal wires formed in a mesh form.

According to the aspect of the present invention, the entire region of a region surrounded by at least three sides of a light-transmitting substrate serves as a light-transmitting region formed of a light-transmitting material. Also a bend part is set in the light-transmitting region. With this input device, the region surrounded by the three sides and the bend part of the light-transmitting substrate serves as the light-transmitting region formed of only the light-transmitting material without a light-non-transmitting wiring part.

Hence, an electronic apparatus using this input device does not have to be provided with a decorative part (frame part) in front of the substrate. Even if the apparatus is provided with the decorative part, the decorative part may have only a small width dimension. The image display region and operation region provided by a display panel can be set to have large areas.

Also, a configuration containing a conductive nanomaterial or metal wires formed in a mesh form are used for a flexible light-transmitting conductive material layer, even when the substrate is bent in the light-transmitting region having the conductive material layer formed therein, the conductive material layer is less likely broken.

DESCRIPTION OF THE PREFERRED EMBODIMENTS

Figure 2:
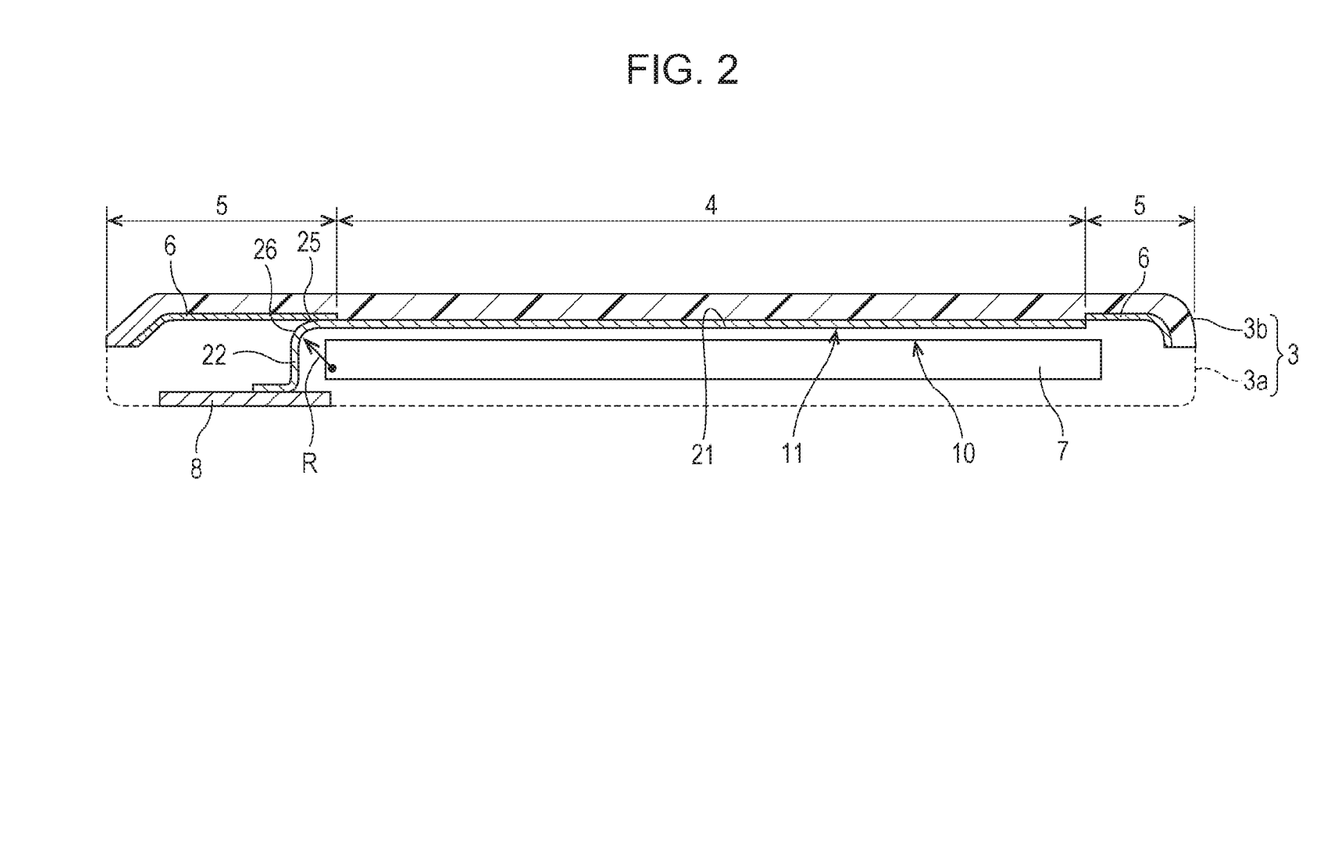
FIG. 2 is a cross-sectional view of the electronic apparatus illustrated in FIG. 1.

An electronic apparatus 1 illustrated in FIG. 2 is used as, for example, a mobile phone, a mobile information processing terminal apparatus, or a game apparatus.

Figure 1:
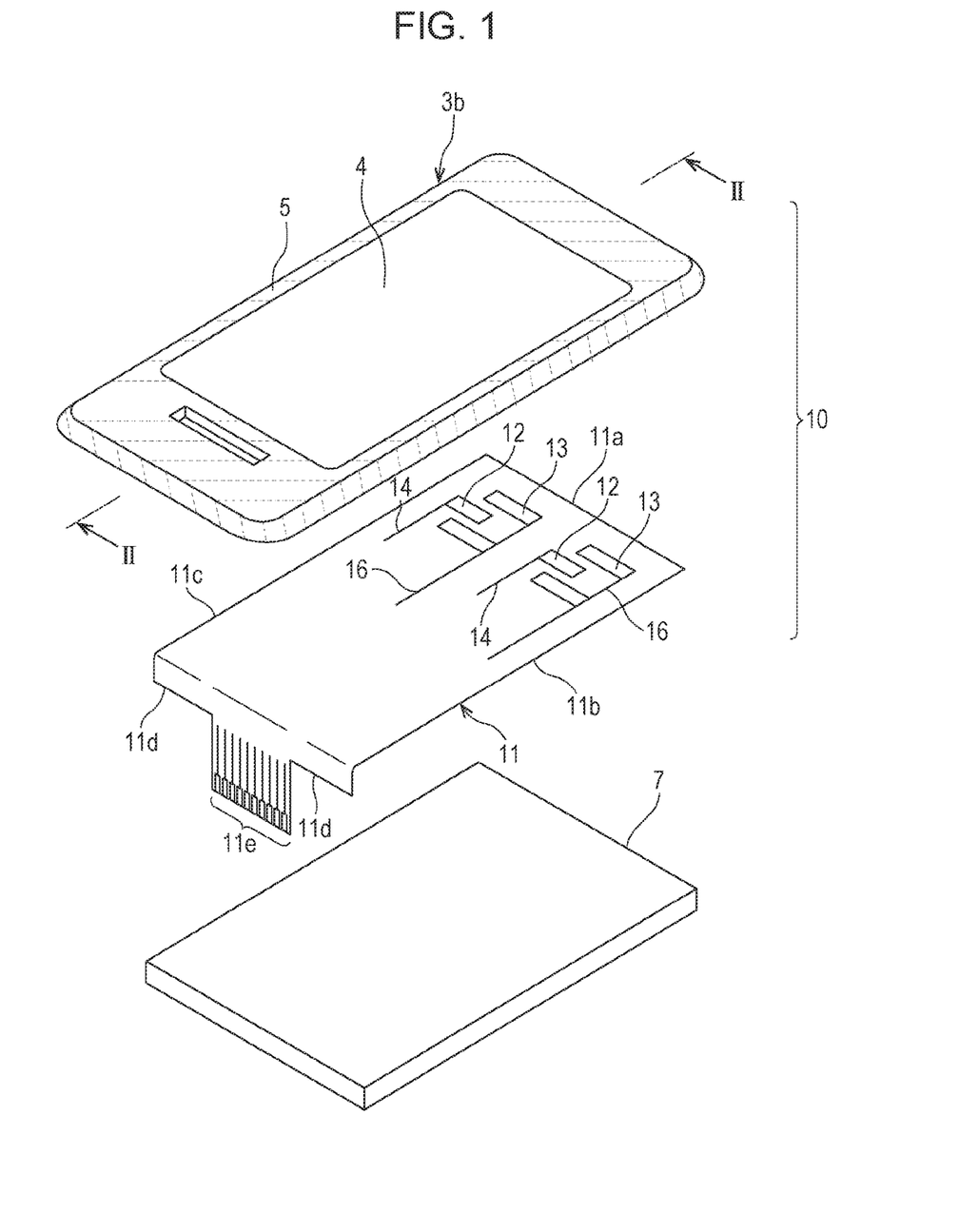
FIG. 1 is an exploded perspective view of an electronic apparatus having mounted thereon an input device according to a first embodiment of the present invention.

As illustrated in FIGS. 1 and 2, the electronic apparatus 1 includes a housing 3. The housing 3 is configured by combining a main body case 3a, and a panel 3b. The main body case 3a is formed of a synthetic resin material. The main body case 3a is formed in a box shape with the upper side being open. FIG. 2 illustrates only the outline of the main body case 3a.

The panel 3b covers the opening of the main body case 3a. The panel 3b is formed of a light-transmitting resin material, such as polycarbonate resin or acrylic resin. The panel 3b includes a light-transmitting window 4 and a decorative part (frame part) 5 surrounding the light-transmitting window 4. The light-transmitting window 4 is formed of only the light-transmitting resin material. The decorative part 5 has a colored part 6 formed on the inner surface etc. of the panel 3b, and hence cannot substantially transmit light.

As illustrated in FIGS. 1 and 2, a light-transmitting substrate 11 is arranged on the inner side of the panel 3b. A circuit board 8 is housed in the housing 3. An end part of the substrate 11 is connected to the circuit board 8. A display panel 7, such as a liquid crystal display panel or an electroluminescence display panel, is housed in the housing 3. A display image on the display panel 7 is visually recognizable from the outside of the panel 3b through the substrate 11 and the light-transmitting window 4.

The light-transmitting state in this specification represents a state in which light is transmitted by a certain amount to allow the display content on the display panel 7 to be visually recognizable. For example, the total light transmittance may be 60% or higher, or more preferably the total light transmittance may be 80% or higher.

A portion of the light-transmitting substrate 11 is bonded to the inner surface of the panel 3b by using an adhesive with high transparency (optical clear adhesive, OCA). In this embodiment, the substrate 11, the circuit board 8, and the panel 3b configure a capacitance-type input device 10. Alternatively, a panel formed of a glass plate or the like may be used in addition to the housing 3, the substrate 11 may be bonded to this panel, and the panel, the substrate 11, and the circuit board 8 may configure the input device 10. Still alternatively, only the substrate 11 and the circuit board 8 may configure the input device 10.

The substrate 11 is formed of a light-transmitting resin film, such as a flexible PET (polyethylene terephthalate) film or a PC (polycarbonate) film.

Figure 3:
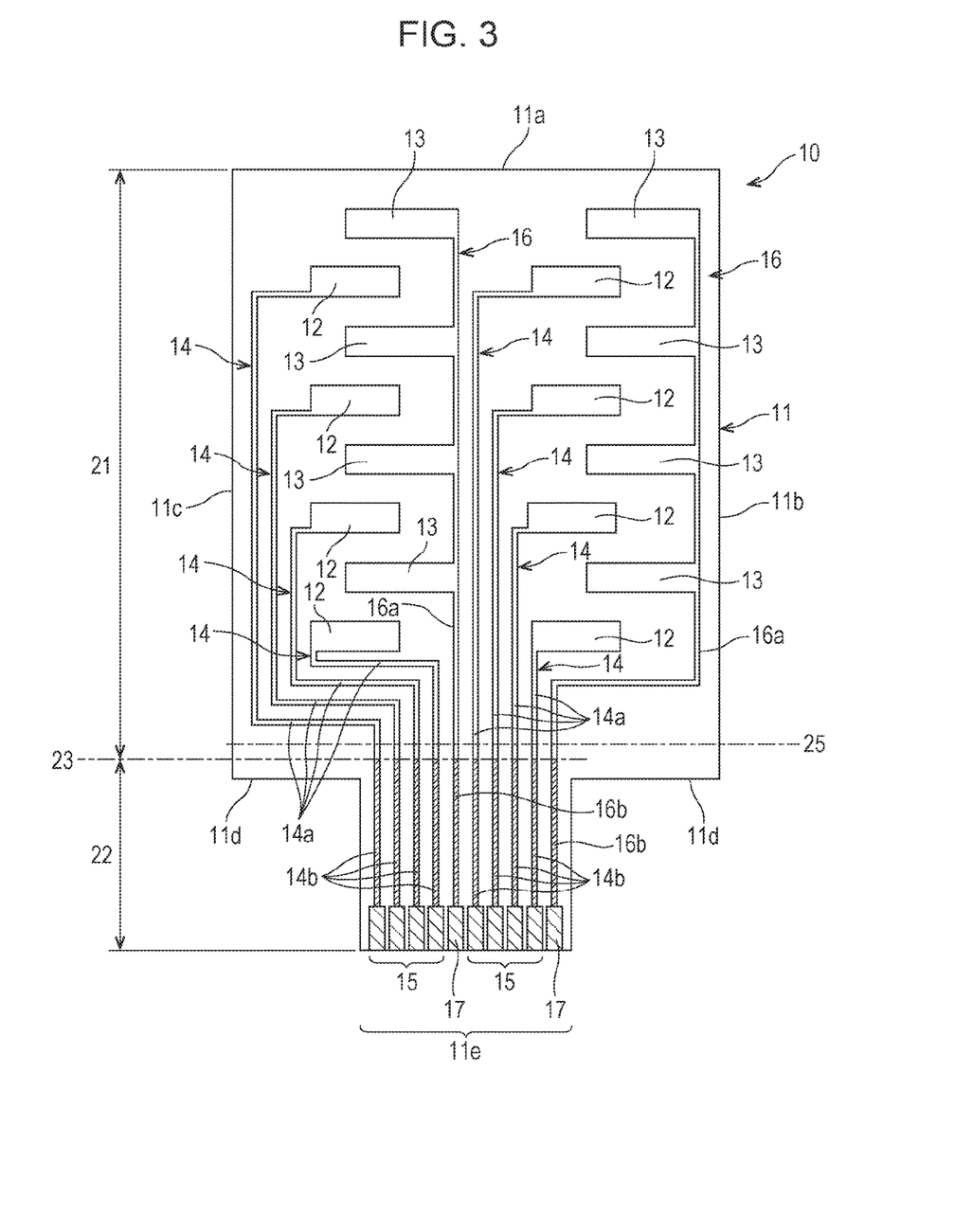
FIG. 3 is a plan view of the input device illustrated in FIG. 1.

As illustrated in FIG. 3, the substrate 11 has an upper end side 11a, and a right lateral side 11b and a left lateral side 11c orthogonal to the upper end side 11a. The substrate 11 has a lower end side 11d opposite to the upper end side 11a. A narrow part 11e is integrally formed in a middle portion of the lower end side 11d. The narrow part 11e is formed to have a width dimension smaller than the opposition distance between the right lateral side 11b and the left lateral side 11c.

A plurality of individual electrode parts 12 and a plurality of common electrode parts 13 are formed in a regular array on a surface of the substrate 11. The individual electrode parts 12 and the common electrode parts 13 are alternately arranged in the up-down direction in the figure.

Individual wiring parts 14 respectively extend from the individual electrode parts 12. The individual wiring parts 14 are respectively connected to individual wiring connector parts 15 arrayed on the narrow part 11e of the substrate 11. Each of the individual wiring parts 14 includes a light-transmitting wiring part 14a extending from the corresponding individual electrode part 12, and a light-non-transmitting wiring part 14b continued from the light-transmitting wiring part 14a. The light-non-transmitting wiring part 14b is connected to the corresponding individual wiring connector part 15.

As illustrated in FIG. 3, four left common electrode parts 13 are connected to a single common wiring part 16, and four right common electrode parts 13 are connected to a single common wiring part 16. The common wiring parts 16 are respectively connected to common wiring connector parts 17 formed on the narrow part 11e. Each of the common wiring parts 16 includes a light-transmitting wiring part 16a extending from the corresponding common electrode part 13, and a light-non-transmitting wiring part 16b continued from the light-transmitting wiring part 16a. The light-non-transmitting wiring part 16b is connected to the corresponding common wiring connector part 17.

Figure 4A:
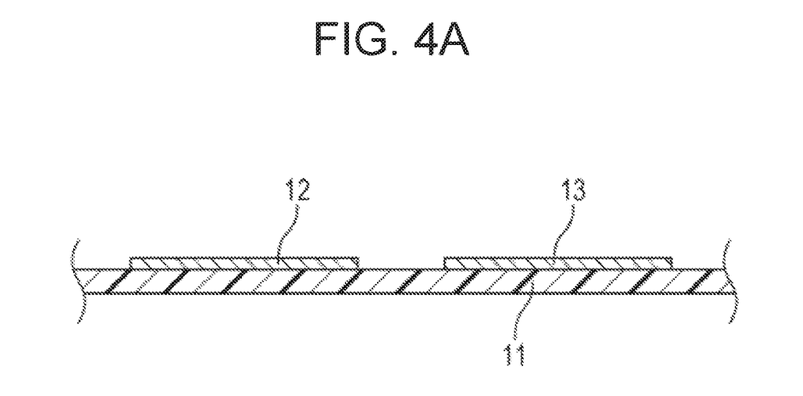
FIG. 4A is a cross-sectional view of electrode parts of the input device illustrated in FIG. 3.
Figure 4B:
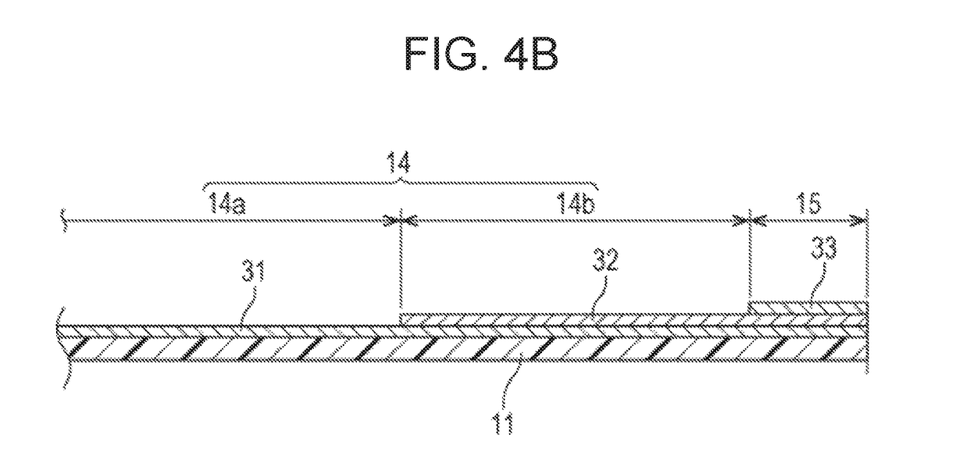
FIG. 4B is a cross-sectional view of a light-transmitting wiring part and a light-non-transmitting wiring part.

FIG. 4A is an enlarged cross-sectional view of a portion of the substrate 11 on which the individual electrode part 12 and the common electrode part 13 are formed. FIG. 4B is an enlarged cross-sectional view when the individual wiring part 14 is cut along the center line extending along the wiring length.

As illustrated in FIG. 4A and FIG. 4B, the individual electrode part 12 and the individual wiring part 14 are formed of a flexible light-transmitting conductive material layer 31. Similarly, the common electrode part 13 and the common wiring part 16 are also formed of the flexible light-transmitting conductive material layer 31.

The flexible light-transmitting conductive material layer 31 in this specification can be defined as a conductive material layer formed of a material that can keep a rise in wiring resistance value within 10% without breakage of the conductive material layer when the substrate 11 is bent by 90 degrees in a curve part with a curvature radius (R) of 10 mm or smaller in a state in which this conductive material layer is formed with a predetermined pattern on the surface of the flexible substrate 11.

The flexible light-transmitting conductive material layer 31 may be formed of, for example, a conductive layer containing a conductive nanomaterial or metal wires formed in a mesh form.

The conductive nanomaterial is a metal nanowire configured of at least one kind selected from Ag, Au, Ni, Cu, Pd, Pt, Rh, Ir, Ru, Os, Fe, Co, and Sn. The conductive nanomaterial has an average minor-axis diameter larger than 1 nm and equal to or smaller than 500 nm. Alternatively, the conductive nanomaterial is carbon fiber such as carbon nanotube. The conductive nanomaterial is applied to the entire region on the surface of the substrate 11 in a dispersed state by a dispersant, and is fixed to the surface of the substrate 11 by a transparent thermoplastic resin (for example, polyvinyl chloride, vinyl chloride-vinyl acetate copolymer, polymethyl methacrylate) or a transparent hardening resin that is hardened by heat, light, an electron beam, or radiation (for example, melamine acrylate, urethane acrylate, isocyanate, epoxy resin). Thus the light-transmitting conductive material layer 31 is formed.

The flexible light-transmitting conductive material layer 31 is formed in the entire region on the surface of the substrate 11. Then, an unnecessary portion is removed, for example, by etching. Thus the individual electrode parts 12, the individual wiring parts 14, the common electrode parts 13, and the common wiring parts 16 are formed.

The metal wires in the mesh form is formed by printing a metal material, such as gold, silver, or copper, in the mesh form on the surface of the substrate 11, or is formed by forming a layer of the metal material with a constant layer thickness and then etching the layer of the metal material into a mesh form. The metal wires in the mesh form is removed from a portion other than the individual electrode parts 12, the individual wiring parts 14, the common electrode parts 13, and the common wiring parts 16.

As illustrated in FIG. 4B, the light-transmitting wiring part 14a of the individual wiring part 14 is formed such that the flexible light-transmitting conductive material layer 31 is exposed, and hence transmits light together with the substrate 11 arranged below the light-transmitting wiring part 14a. For the light-non-transmitting wiring part 14b, a light-non-transmitting low-resistance material layer 32 is laminated on the flexible light-transmitting conductive material layer 31, and hence does not transmit light. The low-resistance material layer 32 is formed of a material, such as silver paste or a copper foil layer, with a lower areal resistance or a lower specific resistance than that of the flexible light-transmitting conductive material layer 31. Further, in the individual wiring connector part 15, a joining metal layer 33 such as gold is formed on the low-resistance material layer 32.

The structure of the light-transmitting wiring part 16a and the light-non-transmitting wiring part 16b of the common wiring part 16 as well as the common wiring connector part 17 is similar to the structure of the light-transmitting wiring part 14a and the light-non-transmitting wiring part 14b as well as the individual wiring connector part 15.

As illustrated in FIG. 3, the substrate 11 may be divided into a light-transmitting region 21 surrounded by the upper end side 11a and the two lateral sides 11b and 11c, and a light-non-transmitting region 22 connected from the light-transmitting region 21 downward in the figure. In the first embodiment, a region boundary part 23 that divides the substrate 11 into the light-transmitting region 21 and the light-non-transmitting region 22 is located in a wide part in which the right lateral side 11b is opposite to the left lateral side 11c.

In the light-transmitting region 21, the individual electrode parts 12 and the light-transmitting wiring parts 14a included in the individual wiring parts 14, as well as the common electrode parts 13 and the light-transmitting wiring parts 16a included in the common wiring parts 16 are arranged. In the light-transmitting region 21, a rectangular region surrounded by the upper end side 11a, the two lateral sides 11b and 11c, and the region boundary part 23 is entirely formed of the light-transmitting material. In the light-transmitting region 21, the light-non-transmitting wiring parts 14b and 16b are not formed. Hence, the light-transmitting region 21 entirely transmits light.

In the light-non-transmitting region 22, the light-non-transmitting wiring parts 14b included in the individual wiring parts 14, the light-non-transmitting wiring parts 16b included in the common wiring parts 16, and the connector parts 15 and 17 are formed. Hence, the light-non-transmitting region 22 does not partly transmit light.

As illustrated in FIG. 2, the light-transmitting region 21 of the substrate 11 is bonded to the inner side of the panel 3b with OCA arranged therebetween. The light-non-transmitting region 22 of the substrate 11 is not bonded to the panel 3b. A portion of the substrate 11 is bent, and the orientation of the plane in which the light-non-transmitting wiring parts 14b and 16b are formed is changed with respect to the plane in which the electrode parts 12 and 13 are formed. The connector parts 15 and 17 formed in the light-non-transmitting region 22 are connected to the circuit board 8 arranged in the housing 3 by soldering.

In FIGS. 2 and 3, reference sign 25 indicates a boundary part from which the substrate 11 is separated from the inner surface of the panel 3b, or in other words, a bonding boundary part that is an end part of a bonding region where the light-transmitting region 21 is bonded to the panel 3b. In this specification, the bonding boundary part 25 corresponds to a bend part of the substrate 11. The bonding boundary part (bend part) 25 is set in the light-transmitting region 21 of the substrate 11. That is, the bonding boundary part 25 is located closer to the upper end side 11a than the light-transmitting region boundary part 23.

A portion of the substrate 11 surrounded by the upper end side 11a, the two lateral sides 11b and 11c, and the bonding boundary part (bend part) 25 is bonded to the panel 3b. This bonding portion entirely corresponds to the light-transmitting region 21. Hence, the substrate 11 and the panel 3b can be positioned and bonded to each other so that the upper end side 11a, the two lateral sides 11b and 11c, and the bonding boundary part (bend part) 25 are aligned with edge parts of the light-transmitting window 4 of the panel 3b without overlapping between the substrate 11 bonded to the panel 3b and the decorative part 5. In this state, the light-non-transmitting wiring parts 14b and 16b do not appear in the light-transmitting window 4 of the panel 3b.

Also, even if the respective sides of the substrate to be bonded to the panel 3b overlap the decorative part 5, the overlap width does not have to be increased.

Accordingly, the width dimension of the decorative part 5 of the panel 3b can be decreased, the area of the light-transmitting window 4 can be increased as much as possible, and hence an input device 10 having so-called narrow frame structure can be configured.

The orientation of the substrate plane of the substrate 11 can be changed by a curve part 26 having a starting point at the bonding boundary part (bend part) 25. Since the light-transmitting wiring parts 14a and 16a are formed of the flexible light-transmitting conductive material layer 31, even if the bonding boundary part 25 serving as the starting point for the bend is set at the light-transmitting wiring parts 14a and 16a, the possibility that the light-transmitting wiring parts 14a and 16a are broken by the bend is decreased. Also, since the light-transmitting wiring parts 14a and 16a are formed of the flexible light-transmitting conductive material layer 31, even if the curve part 26 is set in the region including the light-transmitting wiring parts 14a and 16a, the curvature radius R of the curve part 26 can be set at 10 mm or smaller.

An operation of the input device 10 having the above-described structure is described.

In the input device 10, the plurality of individual wiring connector parts 15 are sequentially connected to a driving circuit by a multiplexer, and a pulsed driving voltage is sequentially applied to the individual electrode parts 12. Also, the common wiring connector parts 17 are connected to a detector circuit, and the common electrode parts 13 are set as detector electrodes. Since a capacitance is formed between each individual electrode part 12 and each common electrode part 13, if a pulsed driving voltage is applied to any one of the individual electrode parts 12, an electric potential based on a mutual coupling capacitance appears in the common electrode part 13 in accordance with the rise and fall of the pulse.

If a finger or hand that is an electric conductor approaches the front of the light-transmitting window 4 of the panel 3b, the finger or hand absorbs the electric field from the individual electrode part 12, and the mutual coupling capacitance between the electrode parts decreases. Thus the electric potential appearing in the common electrode part 13 changes. The position where the finger or hand approaches can be detected on the basis of the change in electric potential appearing in the common electrode part 13 and information on the individual electrode part 12 to which the driving voltage is applied.

Alternatively, the position where the finger or hand approaches can be detected also by applying a pulsed driving voltage to the common electrode part 13, and sequentially switching and connecting the individual electrode parts 12 in to the detector circuit.

Figure 5:
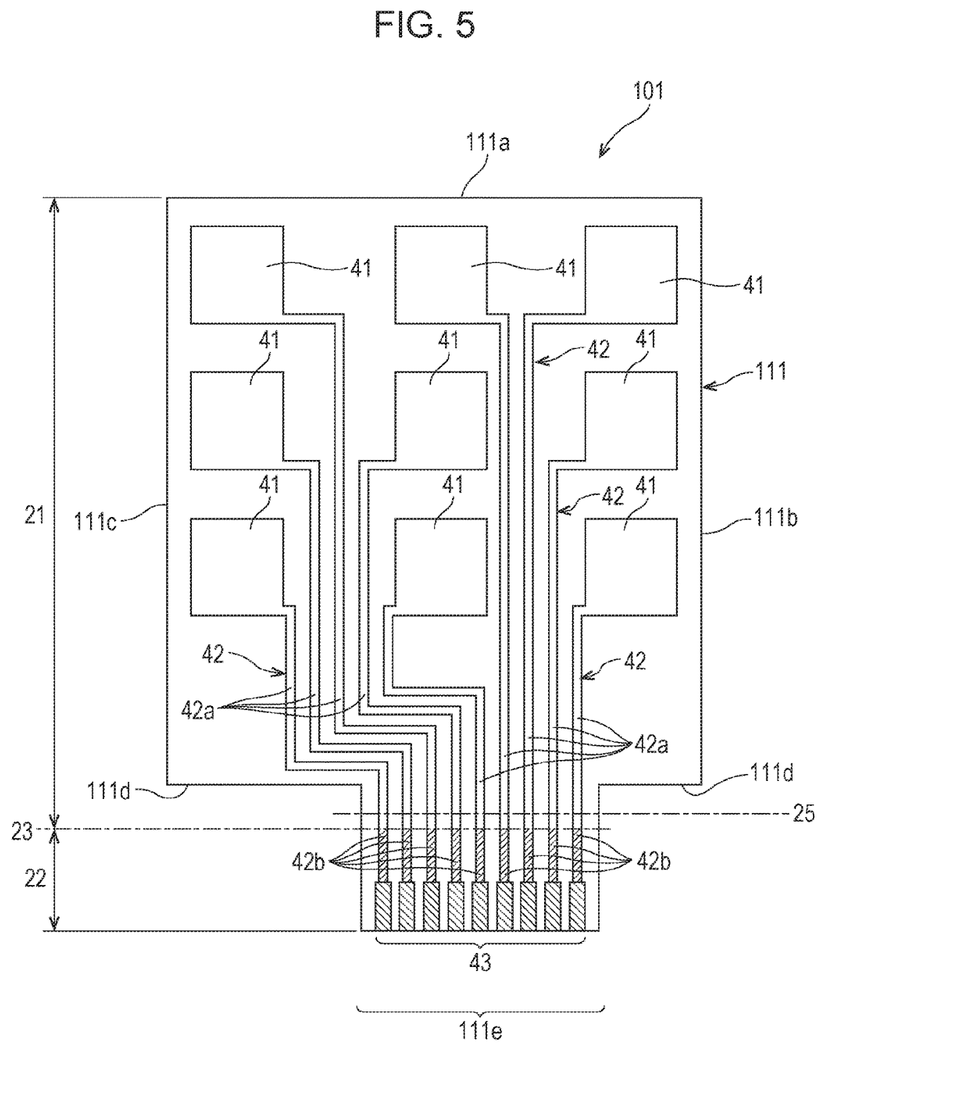
FIG. 5 is a plan view of an input device according to a second embodiment of the present invention.

FIG. 5 is a plan view schematically illustrating an input device 101 according to a second embodiment of the present invention.

A light-transmitting substrate 111 used for the input device 101 according to the second embodiment has an upper end side 111a, a right lateral side 111b, a left lateral side 111c, a lower end side 111d, and a narrow part 111e in a middle part of the lower end side 111d, similarly to the configuration illustrated in FIG. 3.

A plurality of independent electrode parts 41 are formed on a surface of the substrate 111 illustrated in FIG. 5, with constant areas at equal pitches. Independent wiring parts 42 respectively extend from the independent electrode parts 41, and the independent wiring parts 42 are connected to connector parts 43 formed on the narrow part 111e. Each of the independent wiring parts 42 includes a light-transmitting wiring part 42a integrated with the independent electrode part 41, and a light-non-transmitting wiring part 42b extending from the light-transmitting wiring part 42a. The light-non-transmitting wiring part 42b is connected to the connector part 43.

The independent electrode part 41 and the independent wiring part 42 are formed of the same flexible light-transmitting conductive material layer 31 as that of the input device 10 according to the first embodiment. The light-transmitting wiring part 42a transmits light because the flexible light-transmitting conductive material layer 31 is exposed. The light-non-transmitting wiring part 42b does not transmit light because the low-resistance material layer 32 overlaps the flexible light-transmitting conductive material layer 31.

In the substrate 111 illustrated in FIG. 5, the region boundary part 23 that divides the substrate 111 into the light-transmitting region 21 and the light-non-transmitting region 22 is located in a middle part of the narrow part 111e. Hence, the light-transmitting region 21 including the independent electrode parts 41 and the light-transmitting wiring parts 42a contains not only the region surrounded by the upper end side 111a and the two lateral sides 111b and 111c, but also a portion of the narrow part 111e. The light-non-transmitting region 22 including the light-non-transmitting wiring parts 42b is also formed in the residual portion of the narrow part 111e.

The entire region of the portion of the substrate 111 having the right lateral side 111b and the left lateral side 111c formed is bonded to the inner surface of the panel 3b. The bonding boundary part (bend part) 25 that is an end part of the bonding region with respect to the panel 3b is set at a position corresponding to the lower end side 111d of the substrate 111 or a position on the narrow part 111e side with respect to the former position.

The substrate 111 is bent inward of the housing 3 from the bonding boundary part (bend part) 25 similarly to the configuration illustrated in FIG. 2. However, in the second embodiment, the narrow part 111e is bent inward of the housing 3 and connected to the circuit board 8.

In this embodiment, the region surrounded by the upper end side 111a, the lateral sides 111b and 111c, and the bonding boundary part (bend part) 25 is the light-transmitting region 21 where the light-non-transmitting wiring part 42b is not present. This portion is bonded to the panel 3b. The decorative part 5 does not have to overlap the substrate 111, or even if the decorative part 5 overlaps the substrate 111, the overlap width can be decreased. The light-transmitting window 4 can have a wide area accordingly.

Also, since the bonding boundary part (bend part) 25 is set in the light-transmitting wiring parts 42a formed of the flexible light-transmitting conductive material layer 31, the conductive material layer at the bend part of the substrate 111 can be prevented from being broken. The substrate 111 can be freely bent and arranged.

In the input device 101 illustrated in FIG. 5, the individual independent electrode parts 41 may be sequentially connected to the driving circuit and sequentially serve as a driving electrode part, and the independent electrode part 41 arranged next to the driving electrode part may be connected to the detector circuit. Hence a finger or hand can be detected on the basis of the change in mutual capacitance between the electrodes. Alternatively, a driving voltage may be individually applied to the independent electrode parts 41, and a change in current from the independent electrode part 41 to which the driving voltage is applied may be detected. Hence a change in self capacitance can be detected, and an approach of a finger or hand can be detected accordingly.

While the light-transmitting region 21 is a rectangle in the embodiment illustrated in FIG. 3, the light-transmitting region 21 may be a square or a trapezoid. The sides of the substrate 11 defining the light-transmitting region 21 together with the light-transmitting boundary part 23 may be four sides or five sides instead of the three sides 11a, 11b, and 11c. While the portion excluding the narrow part 111e is a rectangle in the embodiment illustrated in FIG. 5, the part may be a square, a trapezoid, or a polygon having five or more corners.

What is claimed is:

1. An input device comprising:
   a substrate made of a light-transmitting material, the substrate having a light-transmitting region, a light-non-transmitting region, and a region boundary dividing the substrate into the light-transmitting region on one side and the light-non-transmitting region on another side;
   a plurality of electrodes patterned from a flexible light-transmitting conductive material layer formed on a surface of the substrate;
   a plurality of light-transmitting wirings patterned from the flexible light-transmitting conductive material layer, the plurality of light-transmitting wirings extending from the plurality of electrodes;
   a plurality of light-non-transmitting wirings each continued from corresponding one of the light-transmitting wirings, the light-non-transmitting wirings including a first layer patterned from the flexible light-transmitting conductive material layer and a second layer made of a light-non-transmitting low-resistance material laminated on the first layer; and
   a light-transmitting panel provided in front of the substrate, the light-transmitting panel being bonded to a portion of the light-transmitting region, while a remaining portion of the light-transmitting region and the light-non-transmitting region continued from the remaining portion are separated from the light-transmitting panel,
   wherein the electrodes and the light-transmitting wirings are formed in the light-transmitting region of the substrate such that an entire region of the light-transmitting region transmits light, while the light-non-transmitting wirings are formed in the light-non-transmitting region of the substrate; and
   wherein a bend portion is provided along and at a certain distance from the region boundary in the light-transmitting region where the light-transmitting wirings are formed, the substrate is bent at the bend portion such that a part of the substrate on which the light-non-transmitting wirings are formed is bent and angled with respect to a remaining part of the substrate on which the electrodes are formed.

2. The input device according to claim 1, wherein the substrate has two opposing lateral sides and an end side therebetween, the end side being orthogonal to the two lateral sides, the light-transmitting region is surrounded by the end side and the two lateral sides, and the bend portion is provided from one of the two lateral sides to the other lateral side across the light-transmitting region.

3. The input device according to claim 1, wherein the substrate includes:
   a first part having a first end side, and two first lateral sides defining a first width therebetween, the plurality of electrodes being disposed on the first part; and
   a second part having a second end side opposing the first end side, and two second lateral sides defining a second width therebetween smaller than the first width,
   wherein the region boundary and the bend portion are provided in the second part.

4. The input device according to claim 1, wherein the flexible light-transmitting conductive material layer contains a conductive nanomaterial.

5. The input device according to claim 1, wherein the flexible light-transmitting conductive material layer is formed of metal wires in a mesh form.

6. The input device according to claim 1, wherein the substrate includes:
   a first part having a first end side, and two first lateral sides defining a first width therebetween, the plurality of electrodes being disposed on the first part; and
   a second part having a second end side opposing the first end side, and two second lateral sides defining a second width therebetween smaller than the first width,
   wherein the region boundary and the bend portion are provided in the first part.

7. An input device comprising:
   a substrate made of a light-transmitting material, the substrate having a light-transmitting region, a light-non-transmitting region, and a region boundary dividing the substrate into the light-transmitting region on one side and the light-non-transmitting region on another side;
   a plurality of electrodes patterned from a flexible light-transmitting conductive material layer formed on a surface of the substrate;
   a plurality of light-transmitting wirings patterned from the flexible light-transmitting conductive material layer, the plurality of light-transmitting wirings extending from the plurality of electrodes; and
   a plurality of light-non-transmitting wirings each continued from corresponding one of the light-transmitting wirings, the light-non-transmitting wirings including a first layer patterned from the flexible light-transmitting conductive material layer and a second layer made of a light-non-transmitting low-resistance material laminated on the first layer,
   wherein the electrodes and the light-transmitting wirings are formed in the light-transmitting region of the substrate such that an entire region of the light-transmitting region transmits light, while the light-non-transmitting wirings are formed in the light-non-transmitting region of the substrate;
   wherein a bend portion is provided along and at a certain distance from the region boundary in the light-transmitting region where the light-transmitting wirings are formed, the substrate is bent at the bend portion such that a part of the substrate on which the light-non-transmitting wirings are formed is bent and angled with respect to a remaining part of the substrate on which the electrodes are formed;
   wherein the substrate includes:
      a first part having a first end side, and two first lateral sides defining a first width therebetween, the plurality of electrodes being disposed on the first part; and
      a second part having a second end side opposing the first end side, and two second lateral sides defining a second width therebetween smaller than the first width; and
   wherein the region boundary and the bend portion are provided in the first part.

8. The input device according to claim 7, wherein the flexible light-transmitting conductive material layer contains a conductive nanomaterial.

9. The input device according to claim 7, wherein the flexible light-transmitting conductive material layer is formed of metal wires in a mesh form.

* * * * *